United States Patent [19]

Kayama

[11] Patent Number: 5,227,655
[45] Date of Patent: Jul. 13, 1993

[54] FIELD EFFECT TRANSISTOR CAPABLE OF EASILY ADJUSTING SWITCHING SPEED THEREOF

[75] Inventor: Chizuru Kayama, Tokyo, Japan
[73] Assignee: NEC Corporation, Tokyo, Japan
[21] Appl. No.: 656,958
[22] Filed: Feb. 15, 1991
[30] Foreign Application Priority Data Feb. 15, 1990 [JP] Japan ................. 2-35380

[51] Int. Cl.⁵ ............... H01L 29/76; H01L 29/94; H01L 29/00
[52] U.S. Cl. ................. 257/380; 257/327; 257/538
[58] Field of Search .......... 357/41, 23.4, 23.13, 357/51; 257/380, 327, 538

[56] References Cited

U.S. PATENT DOCUMENTS

| | | | |
|---|---|---|---|
| 4,688,323 | 8/1987 | Yoshida et al. | 357/23.4 |
| 4,730,208 | 3/1988 | Sugino et al. | 357/23.13 |
| 4,757,363 | 7/1988 | Bohm et al. | 357/23.13 |
| 4,760,434 | 7/1988 | Tsuzuki et al. | 357/23.4 |
| 4,920,388 | 4/1990 | Blanchard et al. | 357/51 |
| 5,012,313 | 4/1991 | Fujihira | 357/23.4 |

FOREIGN PATENT DOCUMENTS

| | | | |
|---|---|---|---|
| 58-44762 | 3/1983 | Japan | 357/51 |
| 60-257576 | 12/1985 | Japan | 357/23.13 |
| 61-190972 | 8/1986 | Japan | 357/23.13 |
| 62-115875 | 5/1987 | Japan | 357/23.13 |
| 2-39563 | 2/1990 | Japan | 357/51 |
| 2-42764 | 2/1990 | Japan | 357/23.4 |

Primary Examiner—Rolf Hille
Assistant Examiner—Steven Loke
Attorney, Agent, or Firm—Laff, Whitesel, Conte & Saret

[57] ABSTRACT

Herein disclosed is a vertical-type field effect transistor having a parallel connection of a diode and a resistor between the gate bonding pad and the gate electrode of the transistor to adjust the switching speed of the transistor without changing the other properties of the transistor.

11 Claims, 7 Drawing Sheets

FIELD EFFECT TRANSISTOR CAPABLE OF EASILY ADJUSTING SWITCHING SPEED THEREOF

BACKGROUND OF THE INVENTION

1. Field of the Invention

The present invention relates to a field effect transistor capable of easily adjusting switching speed thereof, and more particularly, to a vertical-type insulated-gate field effect transistor provided with a structure for adjusting a switching speed thereof.

2. Description of the Related Art

Such a transistor in the prior art is illustrated in FIGS. 1(a) and 1(b). A manufacturing method therefor is described hereinafter. First, on an n+-type silicon substrate 1 is grown an n-type epitaxial layer 2 on which a gate oxide film 3 is formed. Then, at a desired place on the gate oxide film 3, a polysilicon layer is formed as a gate electrode 4. Using this gate electrode 4 as a mask, a base region 9 is formed by an ion implantation of p-type impurities. Subsequently, an aluminium layer (not shown) is selectively formed on the center portion of the base region 9, and then using the gate electrode 4 and the aluminium layer as masks, a source region 10 is formed by an ion implantation. After teh aluminium layer is removed, an oxide film 12 is deposited, and holes are opened at the appropriate places of the oxide film 12 and a source electrode 14 and a gate bonding pad 7 are formed. A drain electrode 15 is formed on the back surface of the silicon substrate 1. Referring to FIGS. 2 and 3, in the case of this conventional transistor 20, there is capacitance $C_{GS}$ and $C_{GD}$ due to the oxide films 12 and 3 for isolation between the source and the gate and between the gate and the drain, respectively. The switching speed depends on the input capacitance $C_{GS}$ and $C_{GD}$ and the capacitance is a function of electrode area dielectric constant and distance between electrodes and hence the switching speed is affected greatly or limited by the structure of the gate electrode. As the drawback, therefore, control of the switching speed by modifying the gate electrode structure inevitably affects other characteristics.

SUMMARY OF THE INVENTION

It is, therefore, an object of the present invention to provide a field effect transistor capable of easily adjusting a switching speed thereof.

A field effect transistor according to the present invention comprises a semiconductor substrate, a base region formed in the semiconductor substrate, a source region formed in the base region, a drain region formed in the semiconductor substrate, a gate electrode formed on or above a main surface of the semiconductor substrate, a source electrode electrically connected to the source region, a drain electrode electrically connected to the drain region, a gate bonding pad formed on or above the semiconductor substrate, a resistor formed on or above the semiconductor substrate, a diode formed on or above the semiconductor substrate, the diode and the resistor being connected in parallel between the gate electrode and the gate bonding pad.

The diode is preferably formed at the periphery of the gate bonding pad, and more preferably the gate bonding pad is surrounded by the diode.

The diode is also preferably formed under and at the periphery of the gate bonding pad, and more preferably the gate bonding pad is surround by the diode.

BRIEF DESCRIPTION OF THE DRAWINGS

The above and further objects, features and advantages of the present invention will become more apparent from the following detailed description taken in conjunction with the accompanying drawings, wherein.

DESCRIPTION OF THE PREFERRED EMBODIMENTS

Figure 1A:
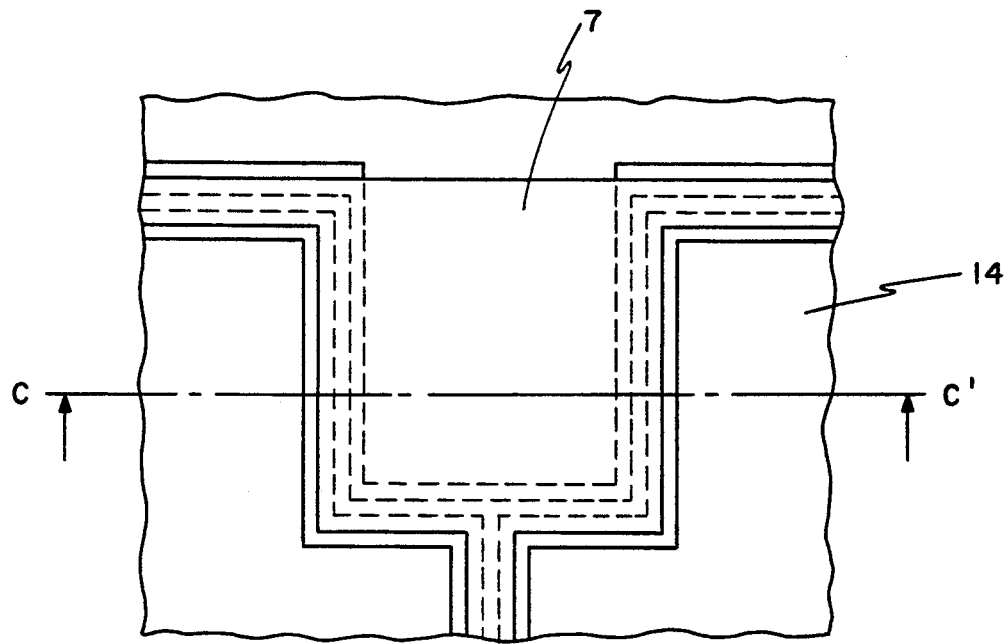
FIG. 1(a) is a fragmentary plan view for explaining a conventional vertical-type field effect transistor.
Figure 1B:
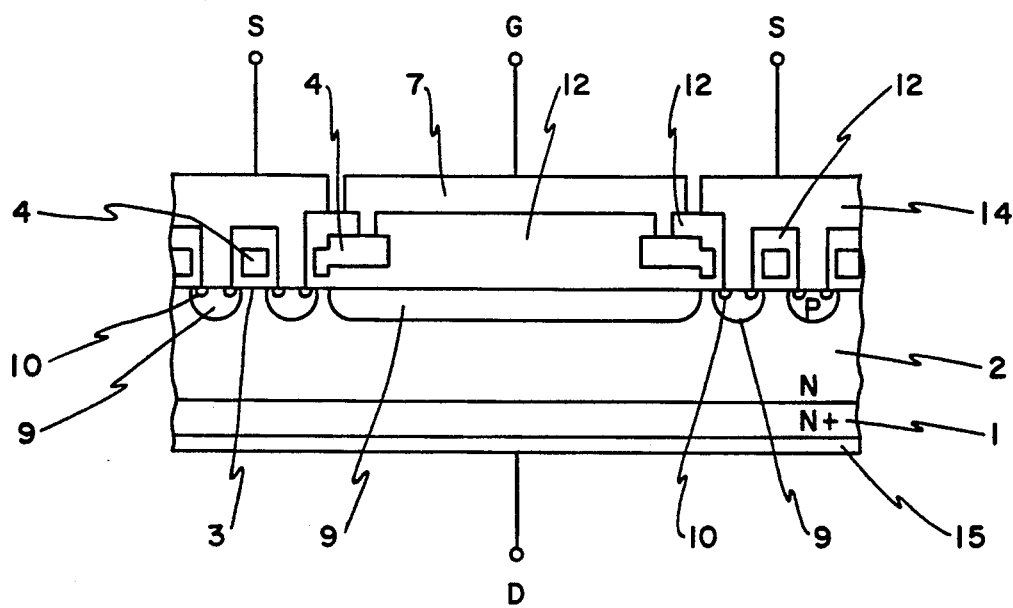
FIG. 1(b) is a cross-sectional view taken along a line C—C' shown in FIG. 1(a)
Figure 2:
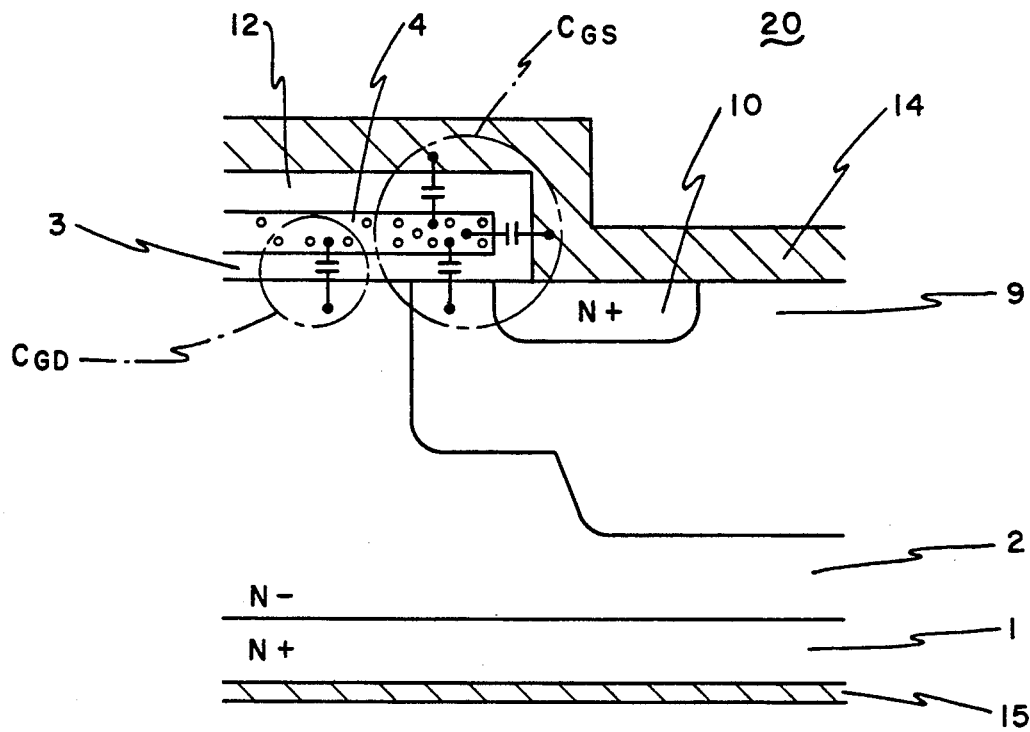
FIG. 2 is a cross-sectional view for explaining parasitic capacitance of a vertical-type field effect transistor.
Figure 3:
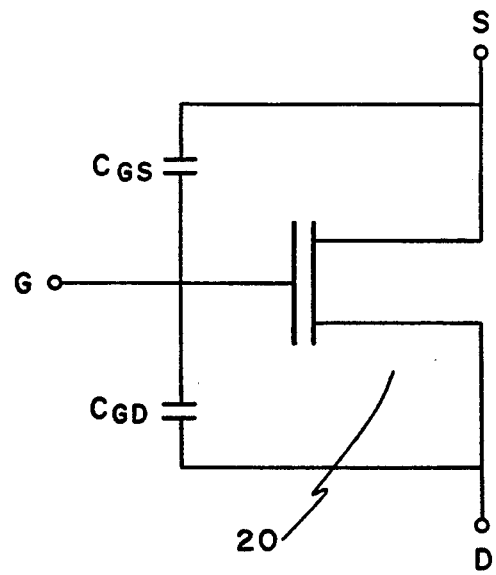
FIG. 3 is an equivalent circuit diagram of the vertical-type field effect transistor shown in FIG. 2.
Figure 4A:
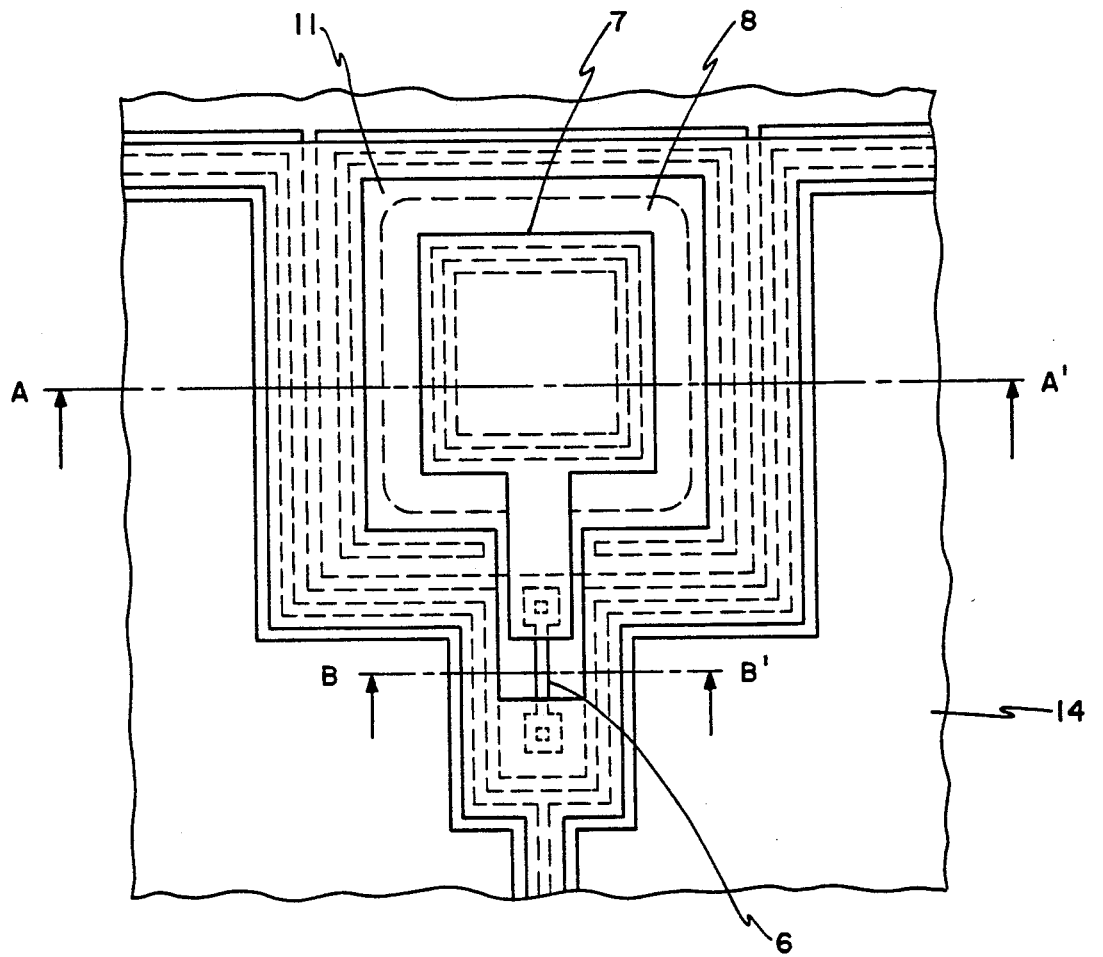
FIG. 4(a) is a fragmentary plan view for explaining a first embodiment of the present invention.
Figure 4B:
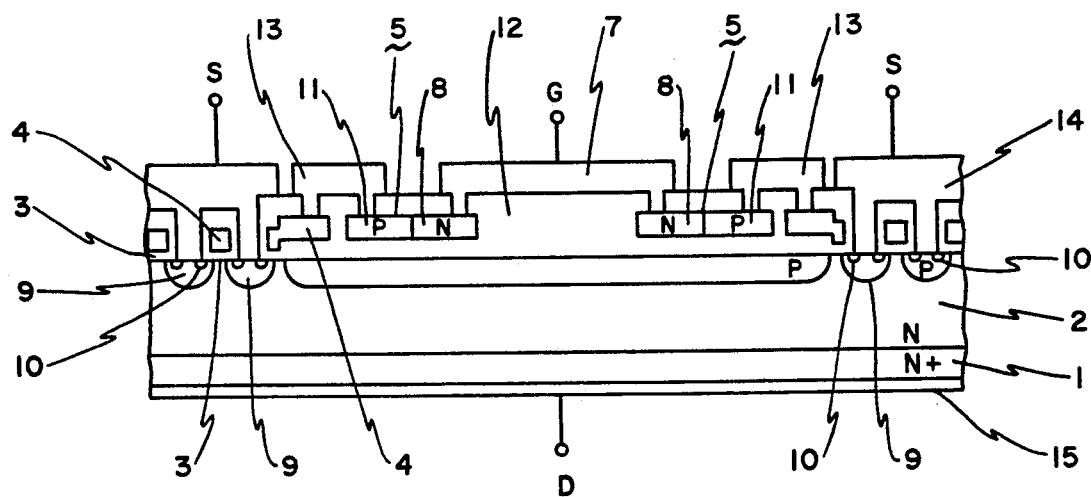
FIG. 4(b) is a cross-sectional view taken along a line A—A' shown in FIG. 4(a)
Figure 4C:
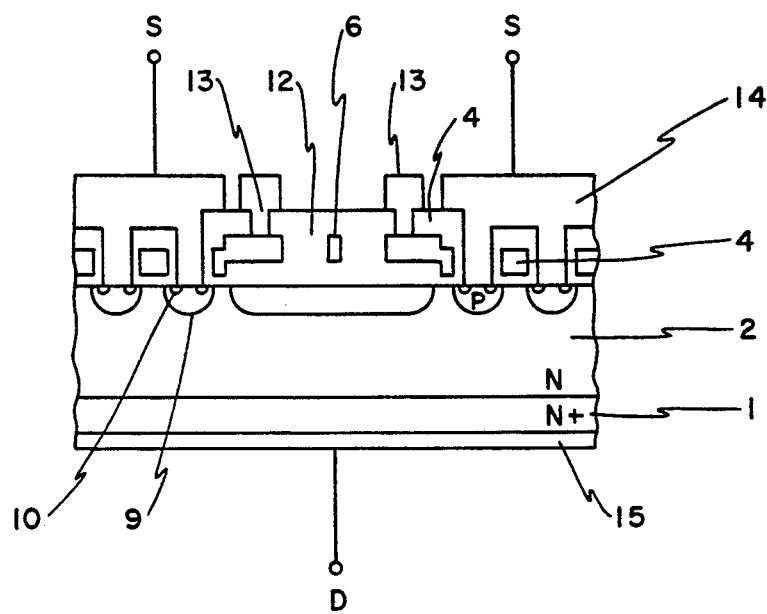
FIG. 4(c) is a cross-sectional view taken along a line B—B' shown in FIG. 4(a)

Referring to FIGS. 4(a)–4(d), over an N+ type silicon substrate 1 is grown an n-type epitaxial layer 2 on the surface of which a gate oxide film 3 is formed. On the gate oxide film 3, a polysilicon layer is deposited and then etched in such a way as a gate electrode 4, a diode 5 and a resistor 6 are formed at the appropriate places around the area where a gate-bonding pad is to be formed.

The breakdown voltage of the diode 5 depends on impurity concentration of the p-type region 11. After the formation of an undoped polysilicon layer, therefore, for keeping a high diode-breakdown voltages of between 5 and 30 V, p-type impurities are ion-implanted into the polysilicon layer at a dosage of $1 \times 10^{13}$ to $1 \times 10^{14}$ cm$^{-2}$, and p-type region 11 is thus formed. subsequently, an aluminium layer (not shown) is selectively formed on the center portion of the base region 9. Then a source region 10 is formed at an appropriate place in a base region 9 by an ion implantation using the polysilicon layer and the aluminium layer as a mask. A resist film is used to mask the p-type region 11 during the ion implantation for the source region 10 so that the impurity concentration for the base region 9, and a aluminium film is used to mask the p-type region 11 during the ion implantation for the source region 10 so that the impurity concentration of p-type region 11 in the diode 5 is not affected by these ion implantations. The n-type region 8 of the diode 5 is formed simultaneously with the formation of the source region by the ion implantation of n-type impurities. The resistor 6 can be adjustable to have a desired resistance by changing the length and width thereof, taking specific resistance 20 to 30 Ω/□ of n-type polysilicon layer into consideration. Each polysilicon layer is isolated by an oxide film 12. The diode 5 consisting of p-type region 11 and n-type region 8 and resistor 6 are electrically connected in parallel via an aluminium electrode 13 between gate electrode 4 and gate bonding pad 7. A source electrode 14 is formed connected to both the source region 10 and the base region 9. A drain electrode 15 is formed on the back surface of the silicon substrate 1.

Figure 5:
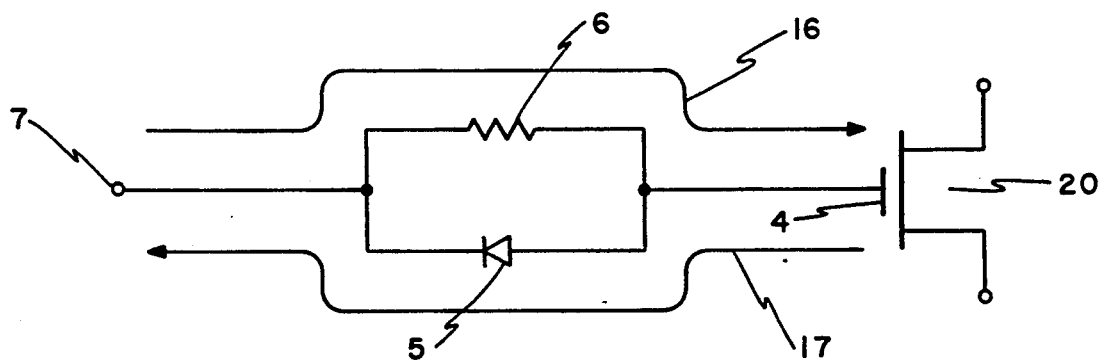
FIG. 5 is an equivalent circuit diagram of the vertical-type field effect transistor shown in FIGS. 4(a)–4(d).
Figure 4D:
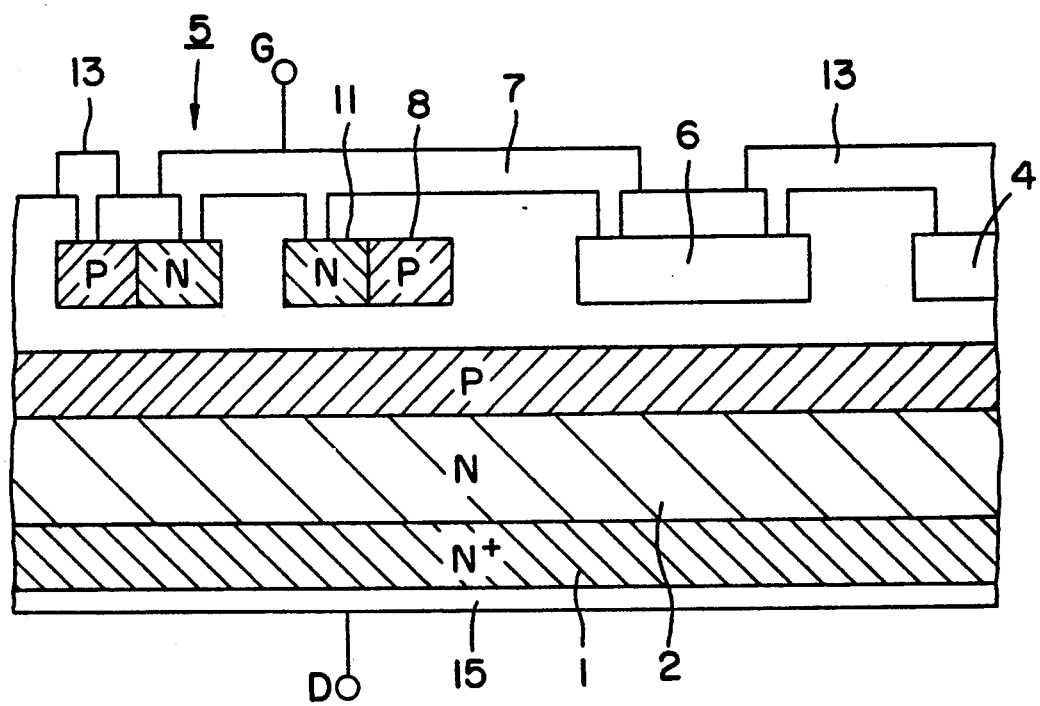
FIG. 4(d) is a cross section along line D—D' of FIG. 4(a)

Referring to FIG. 5, when the field effect transistor 20 is turned on, current 16 flows from bonding pad 7 to the gate electrode 4 via the resistor 6. Time necessary for being turned on, therefore, is controlled by changing the resistance value of the resistor 6. On the other hand, when the transistor 20 is turned off, a forward bias is applied to the diode 5, which allows electric charge accumulated at the transistor 20 to be pulled away by the diode 5, and consequently makes the turn-off speed higher.

A current flowing through the diode 5 depends upon the pn junction's area of the diode 5. Since the pn junction of the diode 5 is formed with the junction surrounding the gate bonding pad 7, the pn junction's area becomes large to make the diode 5 have a large current capacity. Moreover, since the n-type region 8 and the p-type region 11 of the diode 5 is formed under and at the periphery of the gate bonding pad 7, the area of the device is little increased by adding this diode 5.

Figure 6:
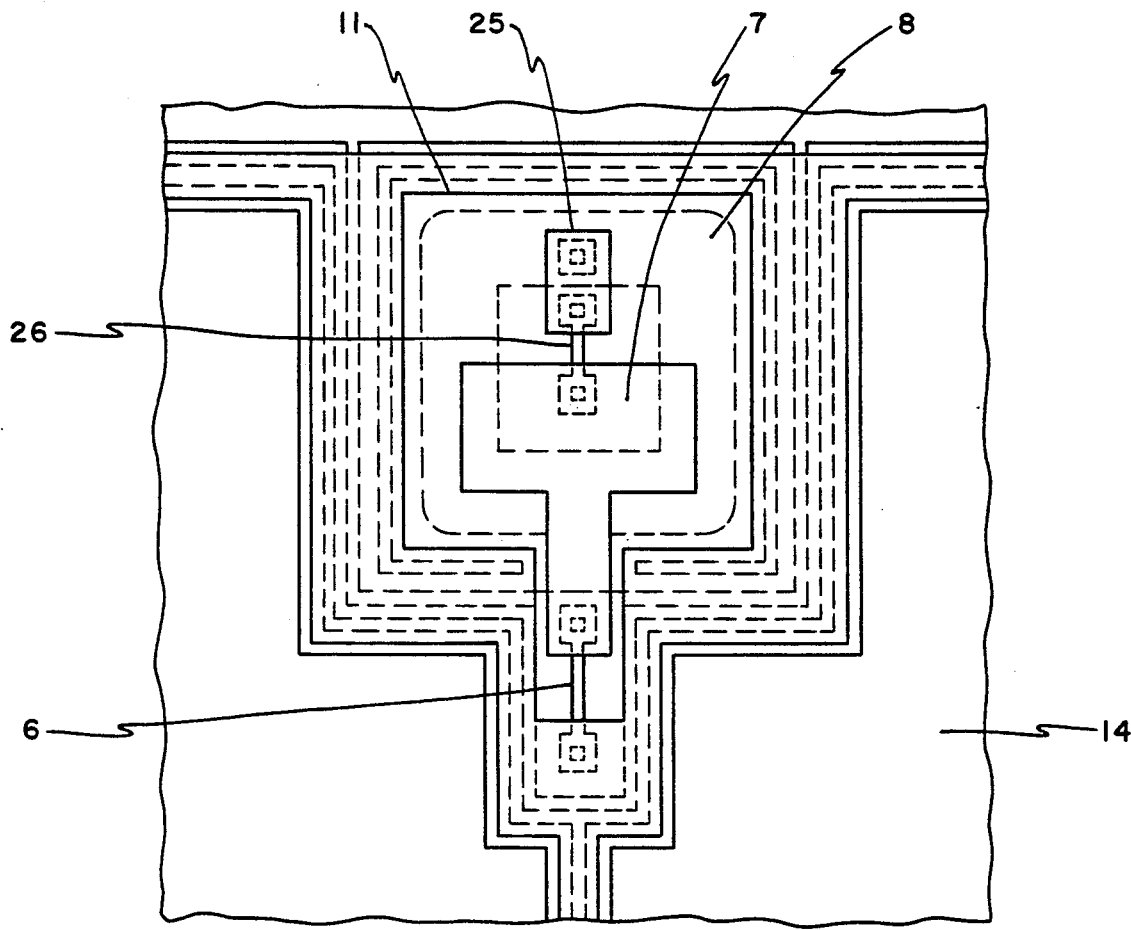
FIG. 6 is a fragmentary plan view for explaining a second embodiment of the present invention.
Figure 7:
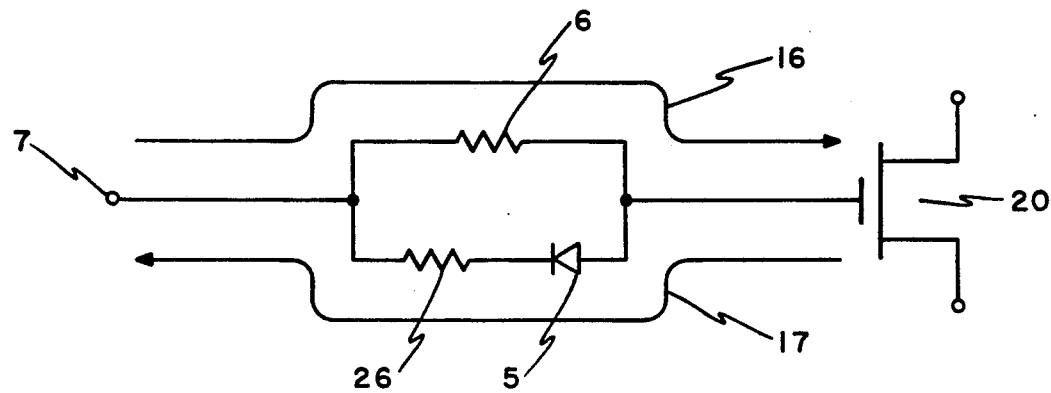
FIG. 7 is an equivalent circuit diagram of the vertical-type field effect transistor shown in FIG. 6.

Referring to FIGS. 6 and 7, an additional resistor 26 is formed between the gate bonding pad 7 and the diode 5. The additional resistor 26 is made of n-type polysilicon layer, layer which is identical to that of the resistor 6, and the resistor 26 is electrically connected to the n-type region 8 by an aluminium electrode 25. A turn-off current can be controlled by both the diode 5 and the resistor 26.

Figure 8:
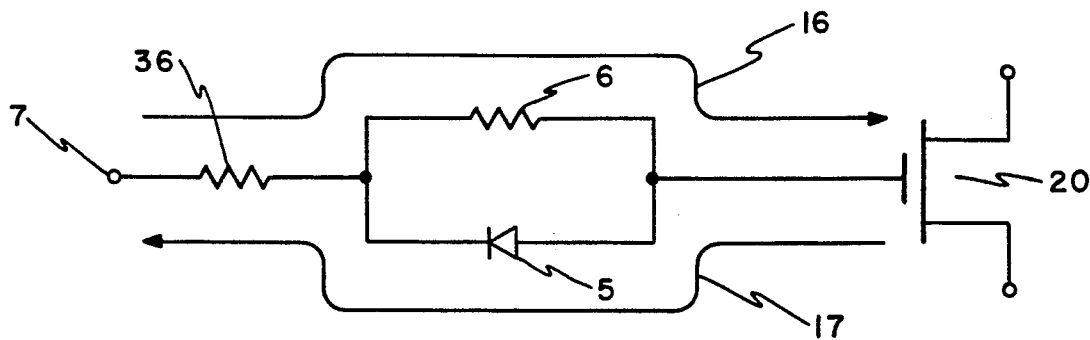
FIGS. 8–11 are equivalent circuit diagrams for explaining the other embodiments of the present invention.

Referring to FIG. 8, an additional resistor 36 is formed beteen the gate bonding pad 7 and the parallel connection of the resistor 6 and the diode 5. A turn-on time is controlled by the resistors 6 and 36, and a turn-off time is controlled by the resistor 36 and the diode 5.

Figure 9:
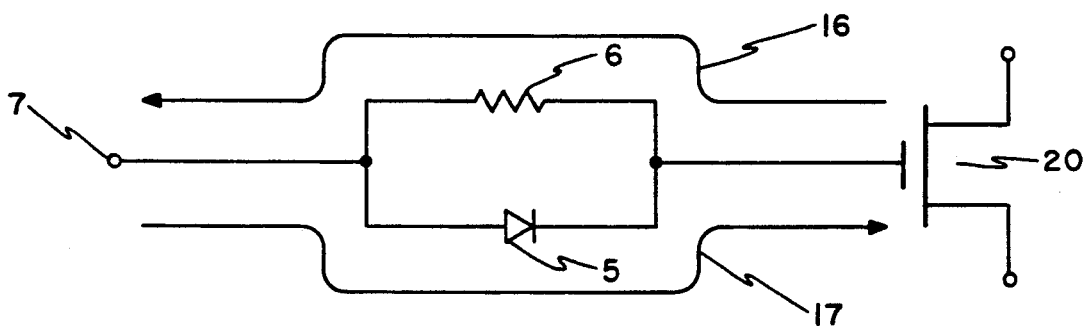
Figure 10:
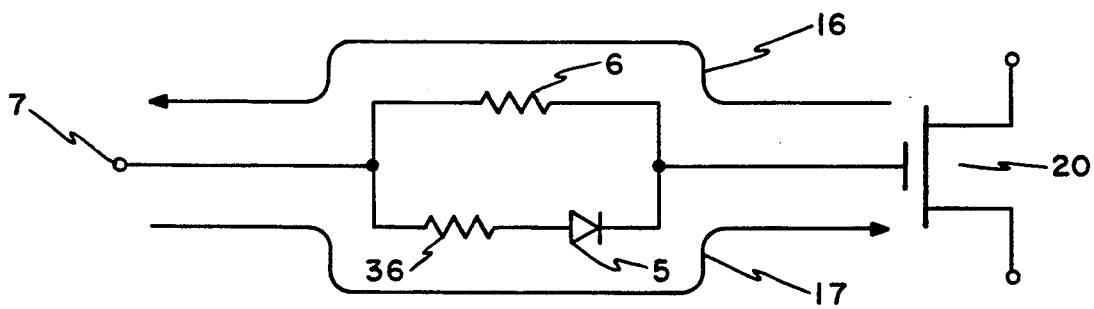
Figure 11:
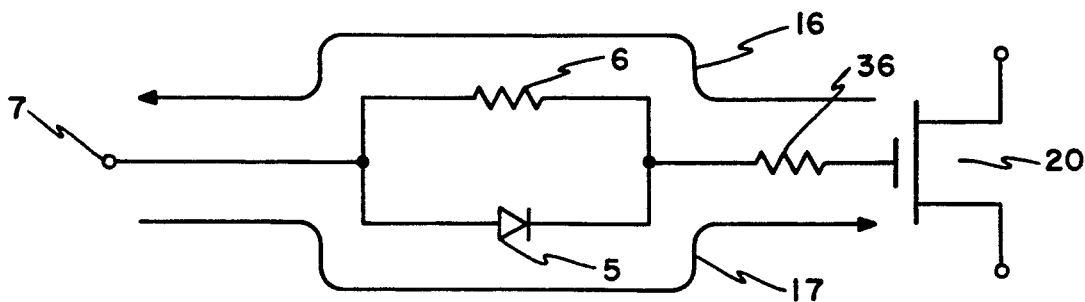

Referring to FIGS. 9 to 11, the polarity of the diode 5 is reversed by interchanging the conductivity type of the p and n type regions 11 and 8 of the diode 5 to increase the turn-on speed and to decrease the turn-off speed.

What is claimed is:
1. A field effect transistor comprising:
a semiconductor substrate;
a base region formed in said semiconductor substrate;
a source region formed in said base region;
a drain region formed in said semiconductor substrate;
a gate electrode formed on a main surface of said semiconductor substrate;
a source electrode electrically connected to said source region;
a drain electrode electrically connected to said drain region;
a gate bonding pad formed on said semiconductor substrate;
a resistor formed on said semiconductor substrate, said resistor having a first end and a second end opposite to said first end; and
a diode formed on said semiconductor substrate, said diode having a first end and a second end opposite to said first end, said first end of said diode and said first end of said resistor being connected to said gate electrode and said second end of said diode and said second end of said resistor being connected to said gate bonding pad in order to form said diode and said resistor in a parallel connection.

2. A field effect transistor as recited in claim 1, wherein said diode is formed at the periphery of said gate bonding pad.

3. A field effect transistor as recited in claim 2, wherein said gate bonding pad is surrounded by said diode.

4. A field effect transistor as recited in claim 1, wherein said diode is formed under and at the periphery of said gate bonding pad.

5. A field effect transistor as recited in claim 4, wherein said gate bonding pad is surrounded by said diode.

6. A field effect transistor as recited in claim 1, wherein said resistor and said diode are made of polysilicon.

7. A field effect transistor as recited in claim 1, wherein said field effect transistor is a vertical-type field effect transistor.

8. A field effect transistor comprising:
a semiconductor substrate;
a base region formed in said semiconductor substrate;
a source region formed in said base region;
a drain region formed in said semiconductor substrate;
a gate electrode formed on a main surface of said semiconductor substrate;
a source electrode electrically connected to said source region;
a drain electrode electrically connected to said drain region;
a gate bonding pad formed at said main surface of said semiconductor substrate;
a resistor made of polysilicon and formed at said semiconductor substrate; and
a diode formed at said semiconductor substrate, said diode and said resistor being connected in parallel between said gate electrode and said gate bonding pad, whereby a switching speed of said field effect transistor can be adjusted by said resistor and said diode.

9. A field effect transistor comprising:
a semiconductor substrate;
a base region formed in said semiconductor substrate;
a source region formed in said base region;
a drain region formed in said semiconductor substrate;
a gate electrode formed on a main surface of said semiconductor substrate;
a source electrode electrically connected to said source region;
a gate bonding pad formed on said main surface of said semiconductor substrate;
a diode formed on said semiconductor substrate, and
a resistor formed on said semiconductor substrate, said diode and said resistor being connected in parallel between said gate electrode and said gate bonding pad,
said diode being formed at the periphery of said gate bonding pad, and said gate bonding pad being surrounded by said diode.

10. A field effect transistor comprising:
a semiconductor substrate;

a base region formed in said semiconductor substrate;
a source region formed in said base region;
a drain region formed in said semiconductor substrate;
a gate electrode formed on a main surface of said semiconductor substrate;
a source electrode electrically connected to said source region;
a gate bonding pad formed on said main surface of said semiconductor substrate;
a diode formed on said semiconductor substrate, and
a resistor formed on said semiconductor substrate, said diode and said resistor being connected in parallel between said gate electrode and said gate bonding pad,
said diode being formed under and at the periphery of said gate bonding pad, and said gate bonding pad being surrounded by said diode.

11. A semiconductor device comprising;
a semiconductor chip;
a field effect transistor formed in said semiconductor chip, said field effect transistor having a gate electrode and a gate bonding pad; and
a resistor made of polysilicon and a diode incorporated in said semiconductor chip, said resistor and said diode being connected in parallel between said gate electrode and said gate bonding pad.

* * * * *